United States Patent
Cho et al.

(10) Patent No.: US 12,217,978 B2
(45) Date of Patent: Feb. 4, 2025

(54) ETCHING DEVICE AND ETCHING METHOD USING THE SAME

(71) Applicant: Samsung Display Co., Ltd., Yongin-Si (KR)

(72) Inventors: Wonje Cho, Osan-si (KR); Duckjung Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 312 days.

(21) Appl. No.: 17/501,374

(22) Filed: Oct. 14, 2021

(65) Prior Publication Data
US 2022/0223436 A1 Jul. 14, 2022

(30) Foreign Application Priority Data
Jan. 11, 2021 (KR) .................. 10-2021-0003393

(51) Int. Cl.
*H01L 21/67* (2006.01)
*H05K 3/00* (2006.01)
*H05K 3/06* (2006.01)

(52) U.S. Cl.
CPC ....... *H01L 21/6708* (2013.01); *H05K 3/0088* (2013.01); *H05K 3/068* (2013.01); *H05K 2203/075* (2013.01); *H05K 2203/1147* (2013.01)

(58) Field of Classification Search
None
See application file for complete search history.

(56) References Cited

U.S. PATENT DOCUMENTS

| | | | |
|---|---|---|---|
| 4,968,375 A | 11/1990 | Sato et al. | |
| 6,793,769 B2* | 9/2004 | Kajino | H01L 21/68785 156/345.55 |
| 2002/0139401 A1* | 10/2002 | Reynolds | H01L 21/6708 134/182 |
| 2015/0147888 A1* | 5/2015 | Nonaka | H01L 21/6708 156/345.21 |
| 2017/0114461 A1* | 4/2017 | Takahashi | C23C 16/45551 |
| 2017/0287769 A1* | 10/2017 | Ota | H01L 21/67109 |

(Continued)

FOREIGN PATENT DOCUMENTS

| KR | 1019900008636 | 6/1990 |
|---|---|---|
| KR | 100442452 B1 | 7/2004 |

(Continued)

OTHER PUBLICATIONS

Machine generated English Translation of the description of KR 200409915. Published Mar. 3, 2006 (Year: 2006).*

(Continued)

*Primary Examiner* — Sylvia Macarthur
(74) *Attorney, Agent, or Firm* — CANTOR COLBURN LLP

(57) ABSTRACT

An etching device includes a nozzle unit including at least one nozzle including an etching solution injection hole, an etching solution collection hole, and a sealing part. The etching solution injection hole is configured to provide an etching solution to an etching object, the etching solution collection hole is configured to collect the etching solution, and the sealing part surrounds the etching solution injection hole and the etching solution collection hole to prevent the etching solution from leakage.

11 Claims, 13 Drawing Sheets

(56) References Cited

U.S. PATENT DOCUMENTS

2019/0148160 A1* 5/2019 Nangoy ................ G01F 5/005
                                                            438/692
2020/0038897 A1* 2/2020 Kamimura ............ B05B 15/555
2022/0223436 A1* 7/2022 Cho .................... H01L 21/6708

FOREIGN PATENT DOCUMENTS

| KR | 100468529 B1 | 1/2005 |
| KR | 200409915 Y1 | 3/2006 |
| KR | 100685393 B1 | 2/2007 |
| KR | 101688492 B1 | 12/2016 |
| KR | 101875104 B1 | 7/2018 |
| KR | 1020200059125 A | 5/2020 |

OTHER PUBLICATIONS

Machine generated English Translation fo the claims of KR 200409915. Published Mar. 3, 2006 (Year: 2006).*

* cited by examiner

FIG. 13
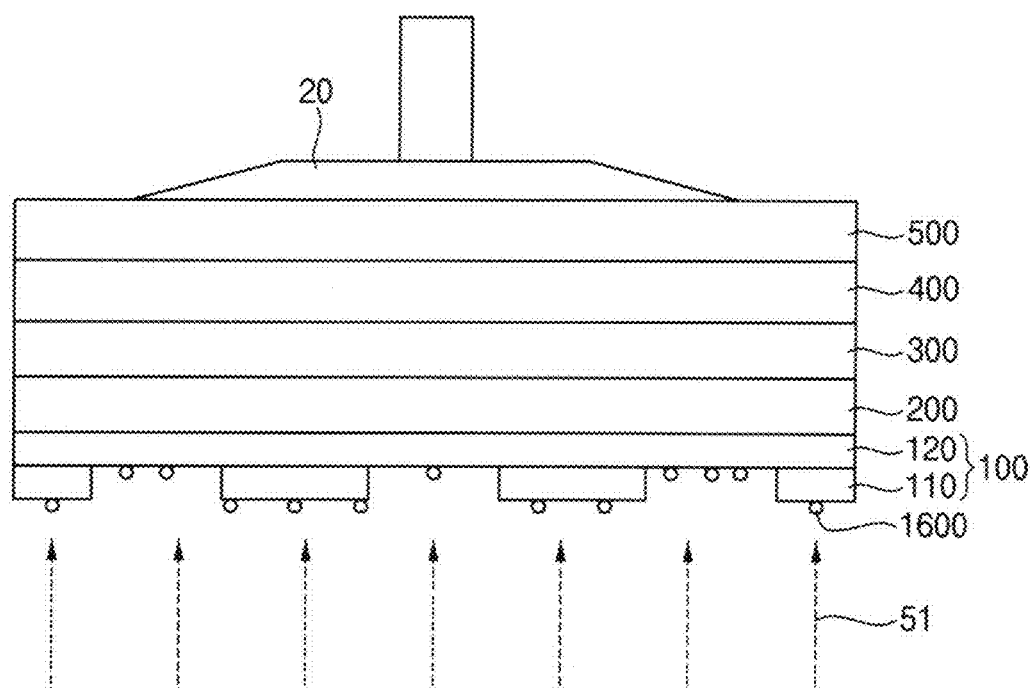
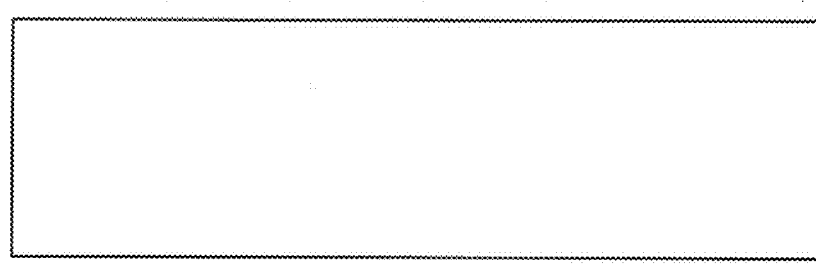
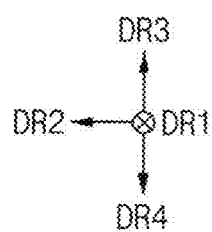

ETCHING DEVICE AND ETCHING METHOD USING THE SAME

This application claims priority under to Korean Patent Application No. 10-2021-0003393 filed on Jan. 11, 2021, and all the benefits accruing therefrom under 35 U.S.C. § 119, the content of which in its entirety is herein incorporated by reference.

BACKGROUND

1. Field

Embodiments relate to an etching device and an etching method using the same.

2. Description of the Related Art

In general, a tiled display device may include a plurality of display devices to implement a large screen. In this case, a bezel positioned at a boundary between the display devices may be visually recognized by a user, so that display quality of the tiled display device may be degraded.

Accordingly, a back bonding may be used when manufacturing the tiled display device so that the bezel is not visible to a user. In order to perform the back bonding, some area of a substrate may be etched.

SUMMARY

Embodiments provide an etching device with improved etching quality.

Embodiments provide an etching method with improved etching quality.

An etching device according to an embodiment includes a nozzle unit including at least one nozzle including an etching solution injection hole, an etching solution collection hole, and a sealing part, where the etching solution injection hole is configured to provide an etching solution to an etching object, the etching solution collection hole is configured to collect the etching solution, and the sealing part surrounds the etching solution injection hole and the etching solution collection hole to prevent the etching solution from leakage.

In an embodiment, the sealing part may include a fluorine-based rubber.

In an embodiment, the sealing part may be disposed in an edge of the nozzle, and the sealing part may surround the entire edges of an etching area of the etching object in a plan view.

In an embodiment, the sealing part may include at least one sealing ring.

In an embodiment, the etching object may include an etching area and a non-etching area, the etching area may be an area on which the etching solution is provided, and the non-etching area may be the remaining area of the etching object excluding the etching area, and the sealing part may contact with an edge of the etching area.

In an embodiment, the sealing part may place the etching solution in a sealed space sealed by the sealing part.

In an embodiment, the etching area may be an area to be bonded to a circuit member.

In an embodiment, the etching object may include a substrate, and the substrate may include the etching area and the non-etching area.

In an embodiment, the substrate may include polyimide ("PI").

In an embodiment, the nozzle may further include a piping part and a heating part, the piping part may be connected to the etching solution injection hole and be configured to provide the etching solution to the etching solution injection hole, and the heating part may be disposed around the piping part and be configured to control a temperature of the etching solution.

In an embodiment, the etching device may further include a fixing member which fixes the etching object.

An etching method according to an embodiment includes: contacting a nozzle unit to a lower surface of an etching object, where the nozzle unit includes at least one nozzle including an etching solution injection hole, an etching solution collection hole, and a sealing part, the etching solution injection hole provides an etching solution to an etching object, the etching solution collection hole collects the etching solution, and the sealing part surrounds the etching solution injection hole and the etching solution collection hole to prevent the etching solution from leakage; and etching the etching object by spraying the etching solution to the lower surface of the etching object through the etching solution injection hole.

In an embodiment, the nozzle unit may contact the lower surface of the etching object such that the sealing part surrounds the entire edges of an etching area of the etching object in a plan view.

In an embodiment, the etching object may include an etching area and a non-etching area, the etching area may be an area on which the etching solution is provided, the non-etching area may be the remaining area of the etching object excluding the etching area, and the sealing part may contact with an edge of the etching area.

In an embodiment, the etching object may include a substrate.

In an embodiment, the substrate may include the etching area and the non-etching area.

In an embodiment, the etching method may further include detaching the substrate from an auxiliary substrate before the nozzle unit contacts the lower surface of the etching object, fixing the etching object to a fixing member and moving the nozzle unit in a direction to the etching object.

In an embodiment, the sealing part may place the etching solution in a sealed space sealed by the sealing part.

In an embodiment, the sealing part may include a fluorine-based rubber.

In an embodiment, the etching method may further include cleaning the etching solution by spraying a cleaning solution by a cleaning unit after the etching object is etched and removing the cleaning solution by a drying unit.

In an etching device according to embodiments of the present invention, the etching device may be disposed under an etching object. The etching device may be disposed under the etching object to etch the bottom surface of the etching object. Accordingly, an etching solution for etching the etching object may etch only an etching area. Accordingly, an accuracy of the etching may be improved, and quality of the etching object may be improved.

BRIEF DESCRIPTION OF THE DRAWINGS

FIG. 13 is a cross-sectional view illustrating an example of a cleaning unit included in an etching device.

DETAILED DESCRIPTION

Figure 1:
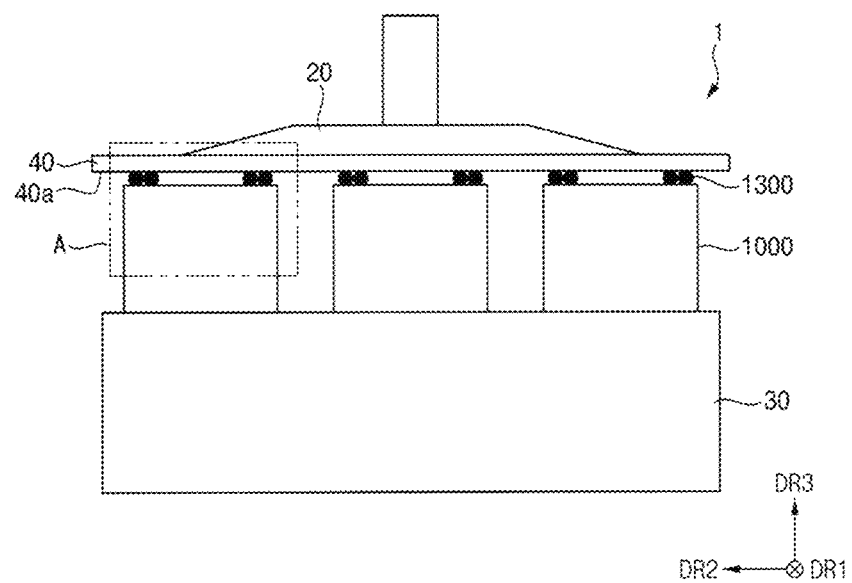
FIG. 1 is a plan view illustrating an etching device according to an embodiment of the present invention.

Hereinafter, display devices in accordance with embodiments will be described in more detail with reference to the accompanying drawings. The same reference numerals are used for the same components in the drawings, and redundant descriptions of the same components will be omitted.

FIG. 1 is a plan view illustrating an etching device according to an embodiment of the present invention.

Figure 14:
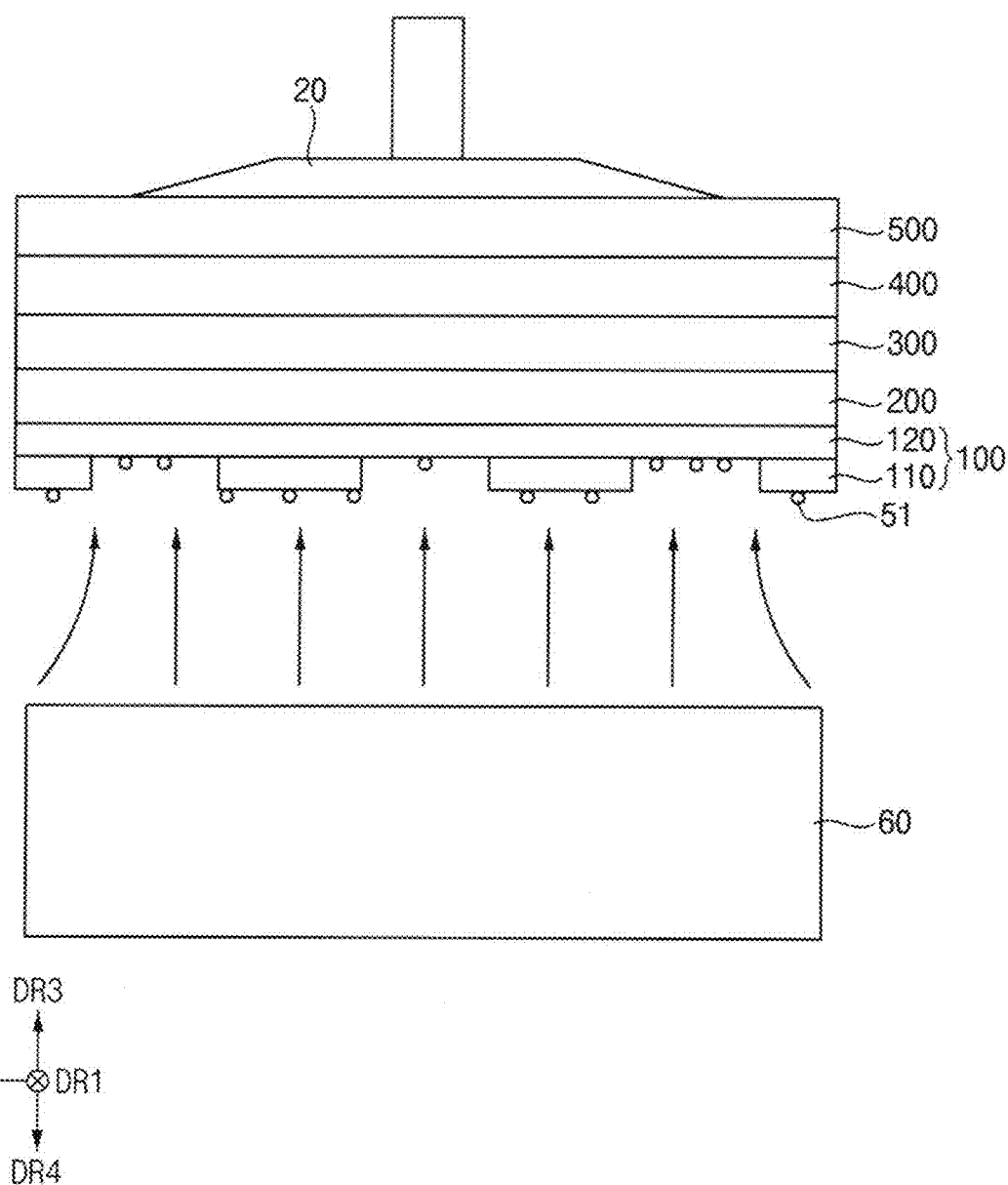
FIG. 14 is a cross-sectional view illustrating an example of a drying unit included in an etching device.

Referring to FIG. 1, an etching device 1 includes a nozzle unit 30, a fixing member 20, a cleaning unit (for example, the cleaning unit 50 of FIG. 13), and a drying unit (for example, the drying unit 60 of FIG. 14). The nozzle unit 30 may include one or more nozzles 1000. In another embodiment, the nozzle unit 30 may include only one nozzle 1000.

The etching device 1 may etch an etching object 40. For example, the etching object 40 may be a display device 10.

Figure 2:
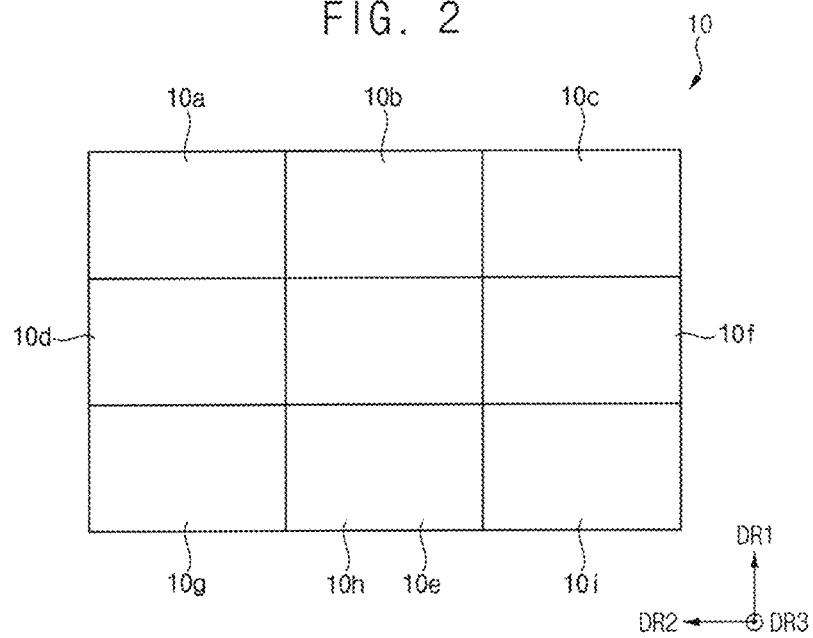
FIG. 2 is a plan view illustrating a display device that is an example of an etching object according to an embodiment.

FIG. 2 is a plan view illustrating a display device that is an example of an etching object according to an embodiment.

Referring to FIGS. 1 and 2, the etching device 1 according to an embodiment of the present invention may etch the etching object 40. The etching object 40 may be a tiled display device including a plurality of display devices. The display devices may display individual images or may divide and display one image. The display devices may include display panels of the same type, structure, size, or method, but the invention is not limited thereto.

The display devices may be arranged in a matrix form along a first direction DR1 and a second direction DR2 crossing the first direction DR1. For example, as illustrated in FIG. 2, the tiled display device may include first to ninth display devices 10a to 10i arranged in a 3×3 form on a plan view (i.e., view in a third direction DR3). Each of the first to ninth display devices 10a to 10i may display first to ninth images. A user may view an image in which the first to ninth images are combined. However, embodiments of the present invention are not limited thereto, and the tiled display device may include 2 to 8 or 10 or more display devices.

Figure 3:
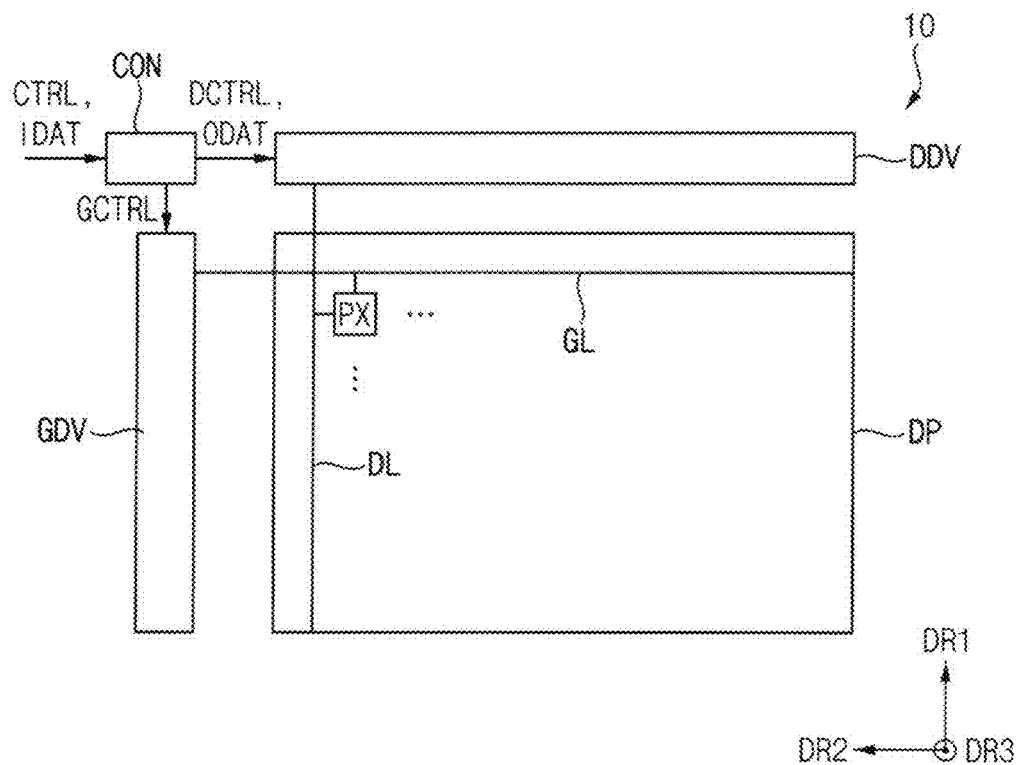
FIG. 3 is a block diagram illustrating a display device according to an embodiment of the present invention.

FIG. 3 is a block diagram illustrating a display device according to an embodiment of the present invention. For example, a display device 10 of FIG. 3 may represent any one of the first to ninth display devices 10a to 10i of FIG. 1.

Referring to FIG. 3, the display device 10 may include a display panel DP and a driving unit. The driving unit may include a driving controller CON, a gate driver GDV, and a data driver DDV.

The display panel DP may include pixels PX, gate lines GL, and data lines DL. The pixels PX may be disposed in a display area for displaying an image. The pixels PX may be electrically connected to the gate lines GL and the data lines DL. For example, the pixels PX may be arranged in a matrix shape along the first direction DR1 and the second direction DR2. For example, the second direction DR2 may be perpendicular to the first direction DR1. Each of the pixels PX may include a thin film transistor and a light emitting diode. The light emitting diode may generate light. The light emitting diode may be an inorganic light emitting diode or an organic light emitting diode.

The gate lines GL and the data lines DL may cross each other. For example, each of the gate lines GL may generally extend in the second direction D2 and may be arranged along the first direction D1. Each of the data lines DL may generally extends in the first direction D1 and may be arranged along the second direction D2.

The driving controller CON may generate a gate control signal GCTRL, a data control signal DCTRL, and an output image data ODAT based on an input image data IDAT and an input control signal CTRL provided from an external device. For example, the input image data IDAT may be RGB data including red image data, green image data, and blue image data. The input control signal CTRL may include a master clock signal and an input data enable signal. The input control signal CTRL may further include a vertical synchronization signal and a horizontal synchronization signal.

The gate driver GDV may generate gate signals based on the gate control signal GCTRL provided from the driving controller CON. For example, the gate control signal GCTRL may include a vertical start signal and a gate clock signal. The gate driver GDV may sequentially output the gate signals to the gate lines GL of the display panel DP.

The data driver DDV may generate data signals based on the data control signal DCTRL and the output image data ODAT provided from the driving controller CON. For example, the data control signal DCTRL may include an output data enable signal, a horizontal start signal, and a load signal. The data driver DDV may output the data signals to the data lines DL of the display panel DP.

In an embodiment, the gate driver GDV and the data driver DDV may be implemented as an integrated circuit. The gate driver GDV and the data driver DDV may include an IC chip, a substrate on which the IC chip is mounted, a film on which the IC chip is mounted, or the like.

Figure 4:
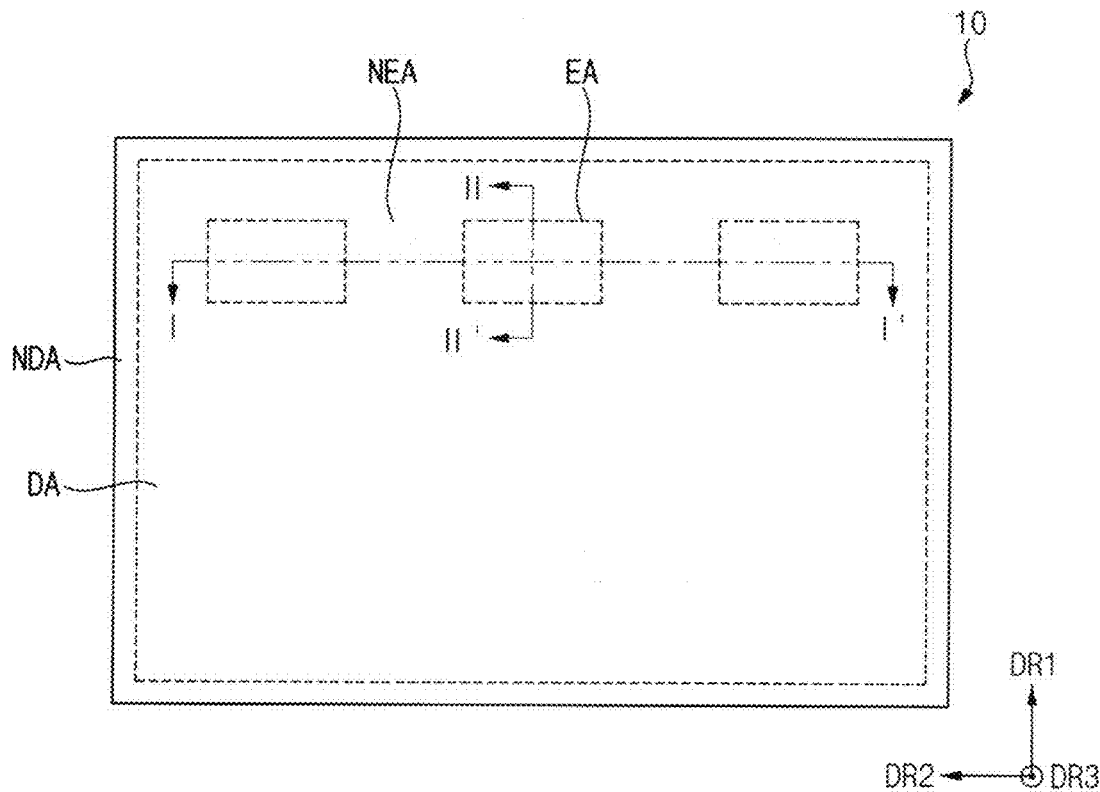
FIG. 4 is a plan view illustrating a display device according to an embodiment of the present invention.
Figure 5:
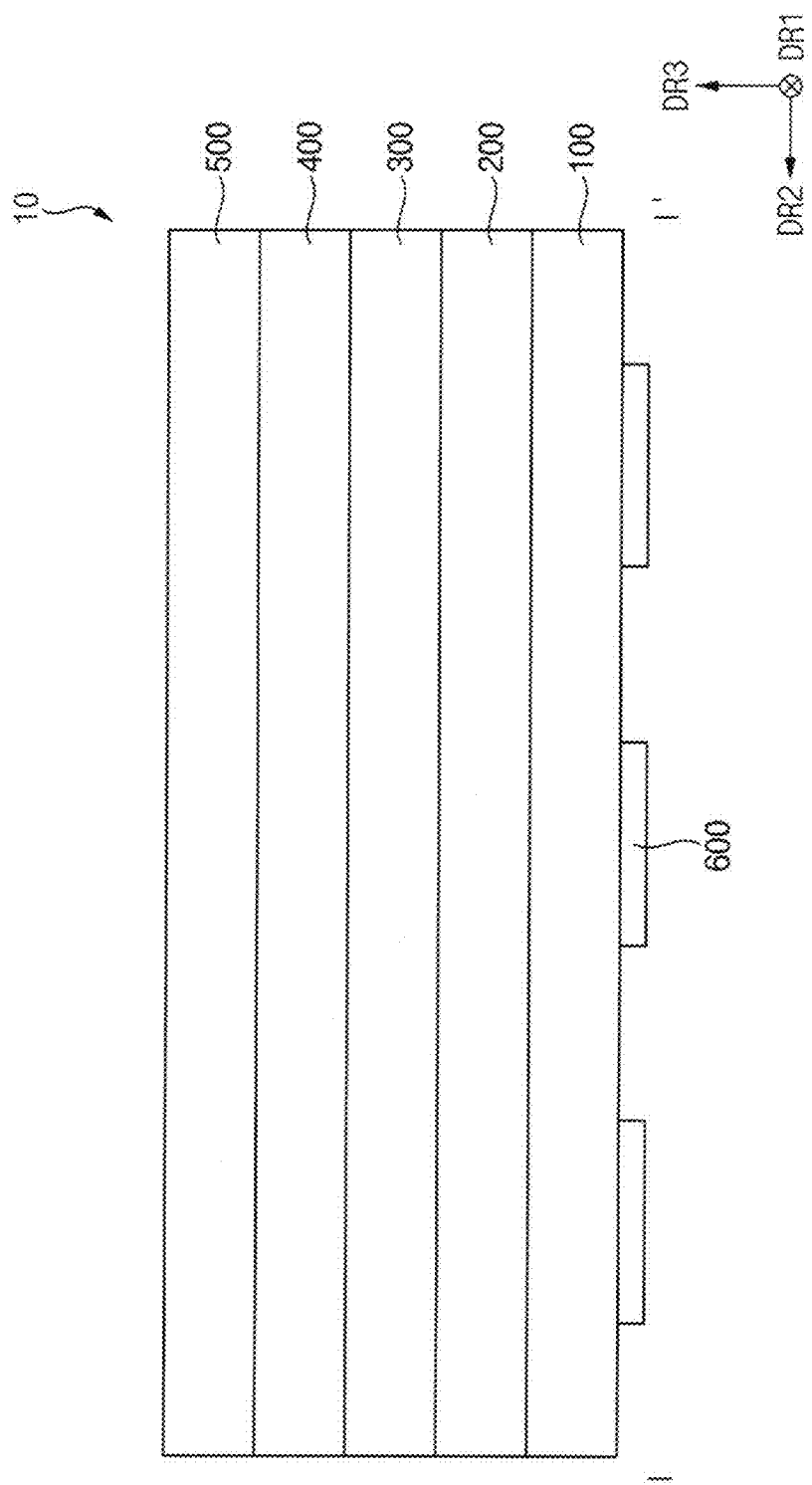
FIG. 5 is a cross-sectional view taken along line I-I' of FIG. 4.
Figure 6:
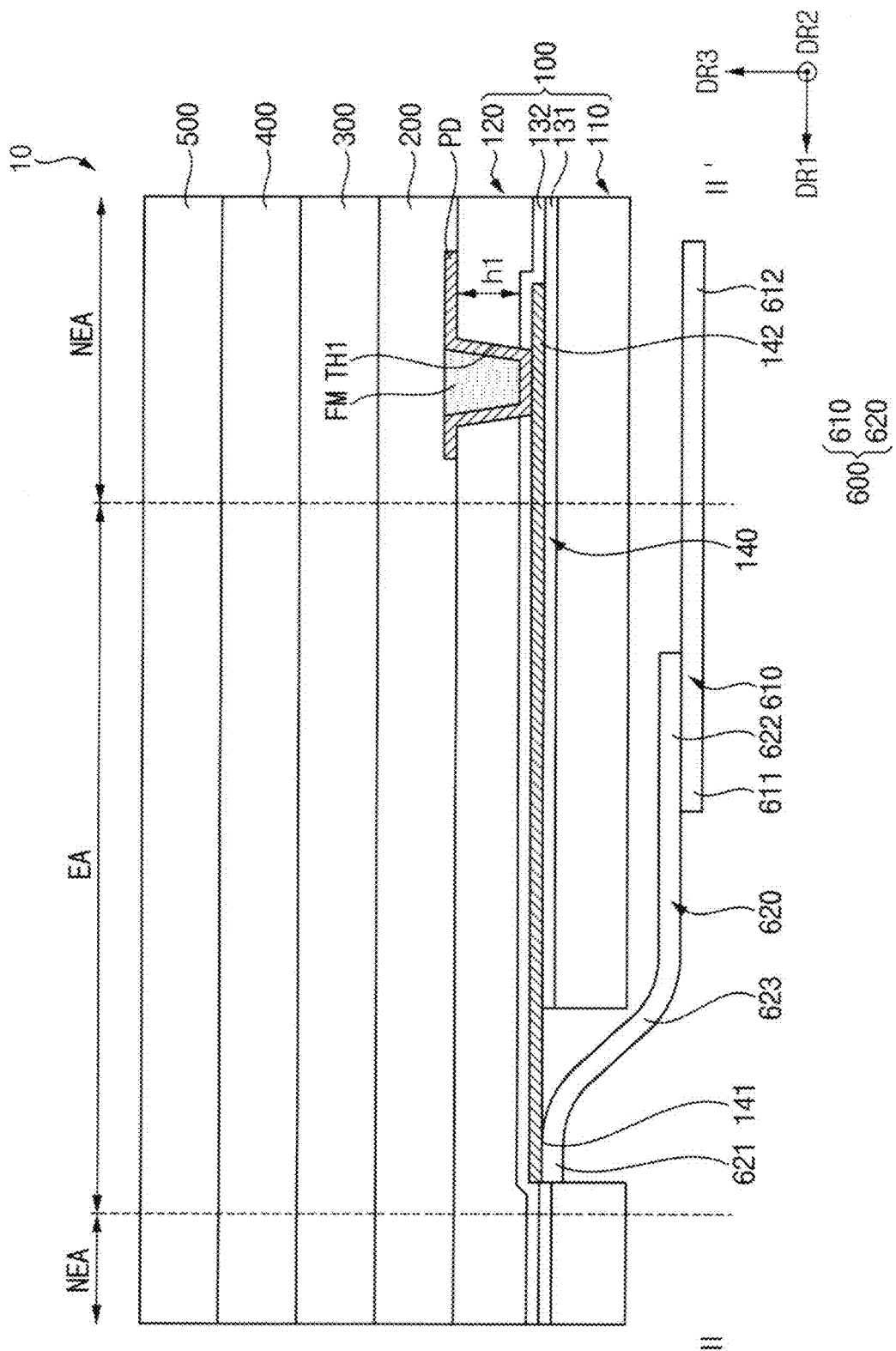
FIG. 6 is a cross-sectional view illustrating an example cut along line II-IP of FIG. 4.

FIG. 4 is a plan view illustrating a display device according to an embodiment of the present invention. FIG. 5 is a cross-sectional view taken along line I-I' of FIG. 4. FIG. 6 is a cross-sectional view illustrating an example cut along line II-IP of FIG. 4. For example, a display device 10 of FIG. 4 may represent any one of the first to ninth display devices 10a to 10i of FIG. 2.

Referring to FIGS. 4 to 6, the display device 10 may include a substrate layer 100, a thin film transistor layer 200, a light emitting diode layer 300, an encapsulation layer 400, a protective film 500, and a driver 600.

The substrate layer 100 may include a first substrate 110, a second substrate 120, a first barrier layer 131, a second barrier layer 132, and a connection wiring 140.

The first substrate 110 may be a transparent insulating substrate. The first substrate 110 may have flexibility to enable bending. For example, the first substrate 110 may include polyimide (PI). In addition, the first substrate 110 may include polyether sulfone ("PES"), polyacrylate ("PAR"), polyetherimide ("PEI"), polyethylene naphthalate ("PEN"), polyethylene terephthalate ("PET"), polyphenylene sulfide ("PPS"), polycarbonate ("PC"), cellulose acetate propionate ("CAP"), or the like.

The connection wiring 140 may be disposed on the first substrate 110. The connection wiring 140 may include a conductive material such as metal. The connection wiring 140 may electrically connect a thin film transistor and the driver 600. For example, a second circuit board 620 may be connected to a first end 141 of the connection wiring 140, and a pad electrode PD may be connected to a second end 142 of the connection wiring 140. The second end 142 is opposite to the first end 141.

The second substrate 120 may be disposed on the first substrate 110 and the connection wiring 140. The second substrate 120 may be disposed between the connection wiring 140 and the thin film transistor layer 200. For example, the second substrate 120 may include substantially the same material as the first substrate 110.

The first barrier layer 131 and the second barrier layer 132 may be disposed between the first substrate 110 and the second substrate 120. The first barrier layer 131 may be disposed between the first substrate 110 and the connection wiring 140. The first barrier layer 131 may include an inorganic insulating material such as silicon oxide, silicon nitride, and silicon oxynitride. The first barrier layer 131 may improve adhesion between the first substrate 110 and the connection wiring 140.

The second barrier layer 132 may be disposed between the connection wiring 140 and the second substrate 120. The second barrier layer 132 may include an inorganic insulating material. The second barrier layer 132 may improve adhesion between the second substrate 120 and the connection wiring 140.

The thin film transistor layer 200 may be disposed on the substrate layer 100. The thin film transistor layer 200 may include at least one thin film transistor electrically connected to the pad electrode PD. The light emitting diode layer 300 may be disposed on the thin film transistor layer 200. The light emitting diode layer 300 may include at least one light emitting diode electrically connected to the thin film transistor. The encapsulation layer 400 may be disposed on the light emitting diode layer 300. The protective film 500 may be disposed on the encapsulation layer 400.

The pad electrode PD may be disposed between the first substrate 110 and the thin film transistor layer 200. The pad electrode PD may be disposed on the connection wiring 140. That is, the connection wiring 140 may be disposed between the first substrate 110 and the pad electrode PD. The pad electrode PD may be electrically connected to the connection wiring 140 and the thin film transistor. The pad electrode PD may include a conductive material such as metal.

The second substrate 120 may have a first through-hole TH1 overlapping the second end 142 of the connection wiring 140 in a plan view. The first through-hole TH1 may penetrate the second substrate 120 and the second barrier layer 132. The first through-hole TH1 may expose at least a portion of the second end 142 of the connection wiring 140. The pad electrode PD may be disposed on the second substrate 120 and may be electrically connected to the second end 142 of the connection wiring 140 through the first through-hole TH1. For example, the pad electrode PD may directly contact the connection wiring 140.

The pad electrode PD may extend into the first through-hole TH1. For example, as illustrated in FIG. 6, the pad electrode PD may cover a side surface and a lower surface of the first through-hole TH1.

A filling member FM may be disposed inside the first through-hole TH1. The filling member FM may contact the pad electrode PD. The filling member FM may compensate a step by filling inside the first through-hole TH1.

The driver 600 may include a first circuit board 610, a second circuit board 620, and a driving integrated circuit.

The first circuit board 610 may be disposed under the first substrate 110. The second circuit board 620 may electrically connect the first circuit board 610 and the connection wiring 140. That is, the first circuit board 610 may be electrically connected to the thin film transistor through the second circuit board 620, the connection wiring 140, and the pad electrode PD.

A first end 621 of the second circuit board 620 may be connected to the connection wiring 140. For example, the first end 621 of the second circuit board 620 may be attached on the first end 141 of the connection wiring 140 through a conductive adhesive member. For example, the conductive adhesive member may be an anisotropic conductive film.

A second end 622 of the second circuit board 620 may be connected to the first circuit board 610. The second end 622 is opposite to the first end 621. For example, the second end 622 of the second circuit board 620 may be attached on a first end 611 of the first circuit board 610 through the conductive adhesive member. For example, a second end 612 of the first circuit board 610 may be fixed on the lower surface of the first substrate 110, but is not limited thereto. The second end 612 is opposite to the first end 611.

The second circuit board 620 (e.g., the second end 622 of the second circuit board 620) may be bent under the first substrate 110. For example, the second circuit board 620 may have a bending portion 623 capable of bending. The bending portion 623 of the second circuit board 620 may be defined between the first end 621 of the second circuit board 620 and the second end 622 of the second circuit board 620.

Although not illustrated in the drawings, the driving integrated circuit may be mounted on the first circuit board 610 and/or the second circuit board 620. For example, the driving controller CON of FIG. 3 may be mounted on the first circuit board 610. For example, the gate driver GDV and the data driver DDV of FIG. 3 may be mounted on the second circuit board 620. However, this is exemplary, and the etching object 40 according to the present invention is not limited thereto.

Figure 7:
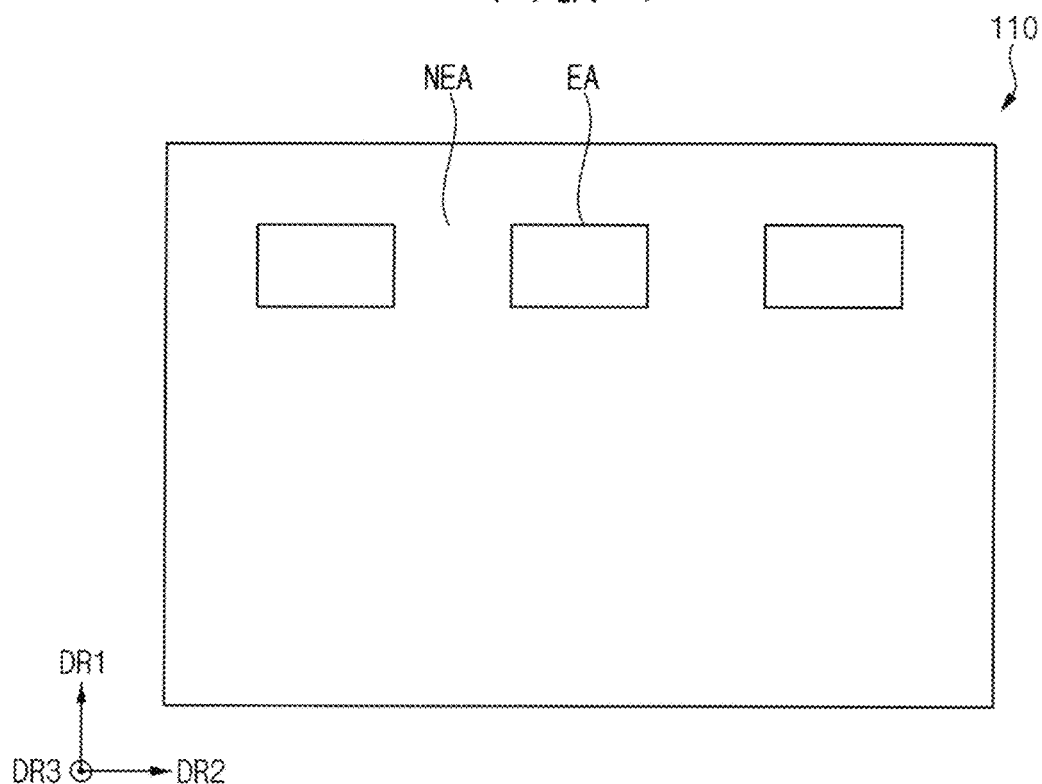
FIG. 7 is a rear view illustrating an example of a first substrate included in a display device.

FIG. 7 is a rear view illustrating an example of a first substrate included in a display device. For example, FIG. 7 may represent a state in which the first substrate 110 included in the display device 10 of FIG. 4 is turned over left and right.

FIGS. 4 to 7, in an embodiment, the first substrate 110 may include an etching area EA and a non-etching area NEA.

The etching area EA of the first substrate 110 may mean an area etched by the etching device (e.g., the etching device 1 of FIG. 1). Accordingly, the etching area EA may mean an opening area penetrating the first substrate 110. However, the present invention is not limited thereto, and in another embodiment, the etching area EA may have a predetermined thickness smaller than the thickness of the non-etching area NEA. The non-etching area NEA may mean a remaining area excluding the etching area EA etched by the etching device 1.

The non-etching area NEA may overlap the pad electrode PD in a plan view. The non-etching area NEA of the first substrate 110 may overlap the second end 142 of the connection wiring 140. The etching area EA may overlap the first end 141 of the connection wiring 140. In addition, the etching area EA may overlap the first end 621 of the second circuit board 620 in a plan view. The first end 141 of the connection wiring 140 and the first end 621 of the second circuit board 620 may contact each other in the etching area EA. Accordingly, the etching area EA may be an area necessary for electrically connecting the thin film transistor and the first circuit board 610.

Figure 8:
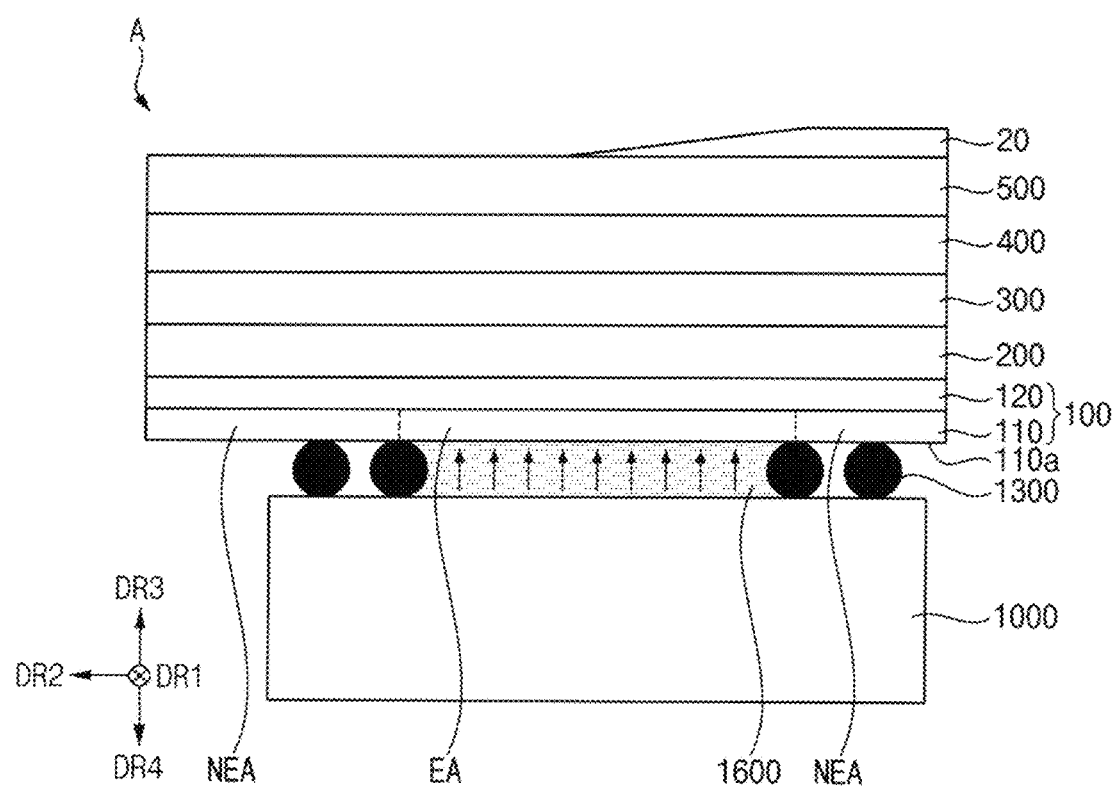
FIG. 8 is an enlarged cross-sectional view of an area A of FIG. 1.
Figure 9:
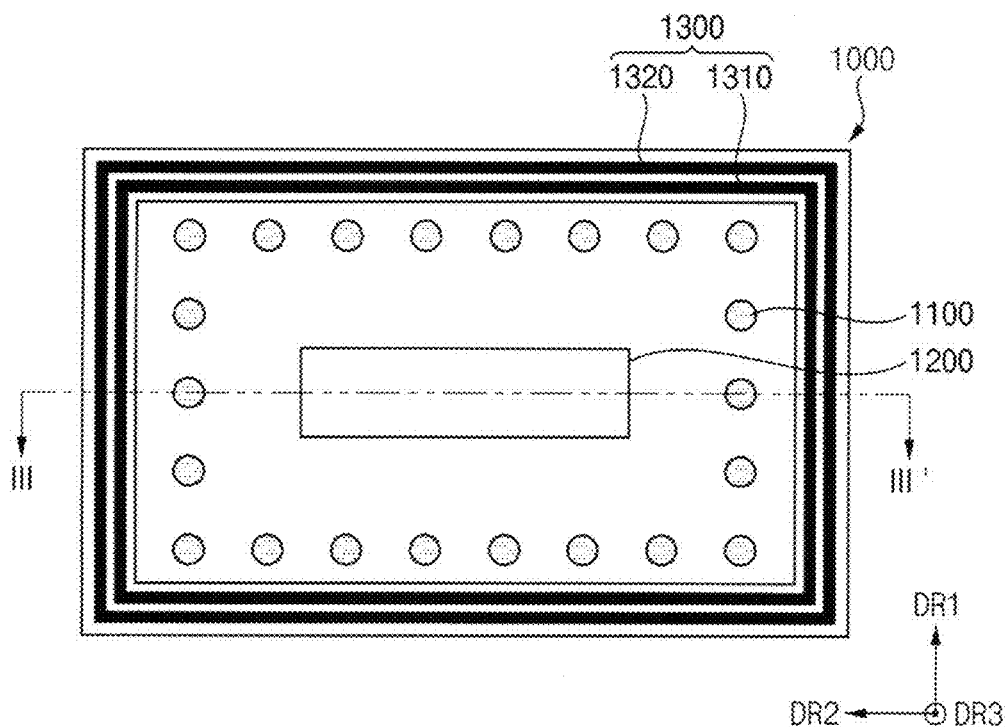
FIG. 9 is a plan view illustrating an example of a nozzle included in the etching device of FIG. 1.
Figure 10:
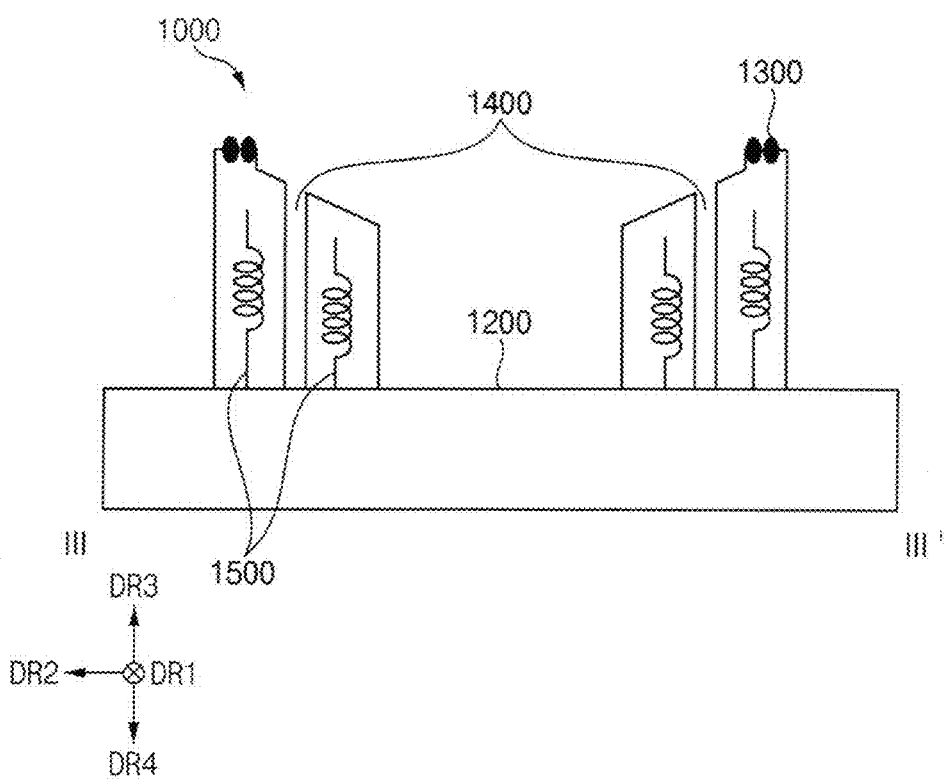
FIG. 10 is a cross-sectional view taken along line III-III' of FIG. 9.

FIG. 8 is an enlarged cross-sectional view of an area A of FIG. 1. FIG. 9 is a plan view illustrating an example of a nozzle included in the etching device of FIG. 1. FIG. 10 is a cross-sectional view taken along line III-III' of FIG. 9.

Referring to FIGS. 1, 8, 9, and 10, the nozzle 1000 may include an etching solution injection hole 1100, an etching solution collection hole 1200, a sealing part 1300, a piping part 1400, and a heating part 1500.

The etching solution injection hole 1100 may provide an etching solution 1600 to the etching object 40. Specifically, the etching solution injection hole 1100 may provide the etching solution 1600 to the etching area EA of the etching object 40. The etching solution injection hole 1100 may receive the etching solution 1600 through the piping part 1400. The etching solution 1600 supplied from the piping part 1400 may be sprayed on a lower surface 40a of the etching object 40 through the etching solution injection hole 1100. The sprayed etching solution 1600 may etch the etching object 40. Specifically, the etching solution 1600 may etch the etching area EA of the etching object 40. The etching solution 1600 may remain on the etching object 40 after etching the etching object 40.

The etching solution 1600 may contain a strong base material. For example, the etching solution 1600 may contain KOH, or the like. The etching solution 1600 may include a material capable of removing the etching object 40. Specifically, the etching solution 1600 may etch the first substrate 110 including PI. Therefore, the etching solution 1600 may include KOH, or the like that is capable of etching PI.

The etching solution collection hole 1200 may collect the etching solution 1600 remaining on the etching object 40 after etching. When the etching solution 1600 continues to remain in the etching object 40 even after etching the etching object 40, the etching solution 1600 may also etch the non-etching area NEA around the etching area EA. The non-etching area NEA can also be etched. That is, the etching object 40 may be etched different from a predetermined pattern. Accordingly, in an embodiment according to the invention, the etching solution collection hole 1200 may collect the remaining etching solution 1600 after etching the etching area EA to prevent the non-etching area NEA from being etched.

The etching solution collection hole 1200 may be disposed in a center of the nozzle 1000. The etching solution collection holes 1200 may have a rectangular shape in a plan view. The etching solution injection hole 1100 may be disposed surrounding the etching solution collection hole 1200. The nozzle 1000 may include a plurality of the etching solution injection holes 1100. The etching solution injection holes 1100 may be disposed around the etching solution collection hole 1200. A portion between a portion of the nozzle 1000 in which the etching solution injection holes 1100 are defined and a portion of the nozzle 1000 in which the etching solution collection hole 1200 is defined may be inclined as shown in FIG. 10. That is, a portion of a upper surface of the nozzle 1000 in which the etching solution collection hole 1200 is defined may be disposed in a level lower than a level of a portion of the upper surface of the nozzle 1000 in which the etching solution injection holes 1100 are defined. Accordingly, the remaining etching solution 1600 may be collected near the etching solution collection hole 1200 along a slope of the upper surface of the nozzle 1000. Accordingly, the etching solution collection hole 1200 may collect the remaining etching solution 1600 more easily.

Figure 11:
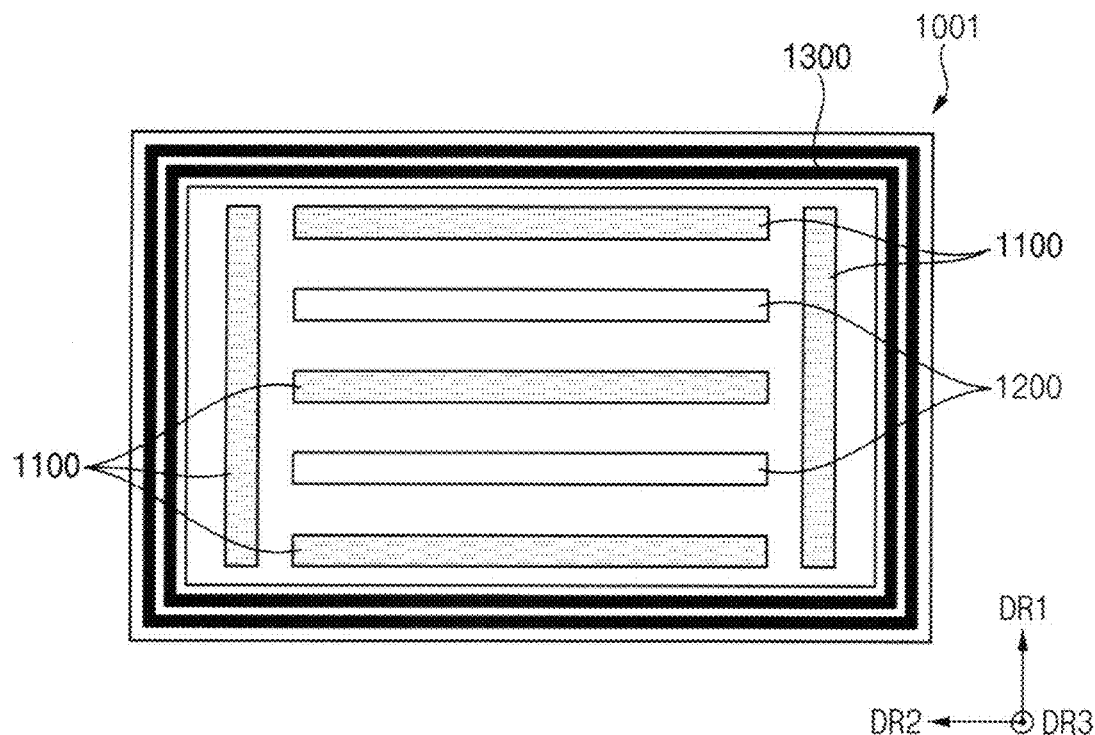
FIG. 11 is a plan view illustrating another example of the nozzle.

FIG. 11 is a plan view illustrating another example of the nozzle.

Referring to FIG. 11, in this embodiment, the etching solution injection holes 1100 may be defined at a center of a nozzle 1001 and locations adjacent to long sides and short sides of the nozzle 1001. In FIG. 11, five etching solution injection holes 1100 are illustrated as an example. Each of etching solution injection holes 1100 may have a rectangular shape in a plan view. Each of etching solution collection holes 1200 may be located between the etching solution injection holes 1100. In FIG. 11, two etching solution collection holes 1200 are illustrated as an example. Like in FIG. 9, a portion between a portion of the nozzle 1001 in which the etching solution injection holes 1100 are defined and a portion of the nozzle 1001 in which the etching solution collection holes 1200 are may be inclined. Accordingly, the etching solution collection holes 1200 may collect the remaining etching solution 1600 more easily.

Figure 12:
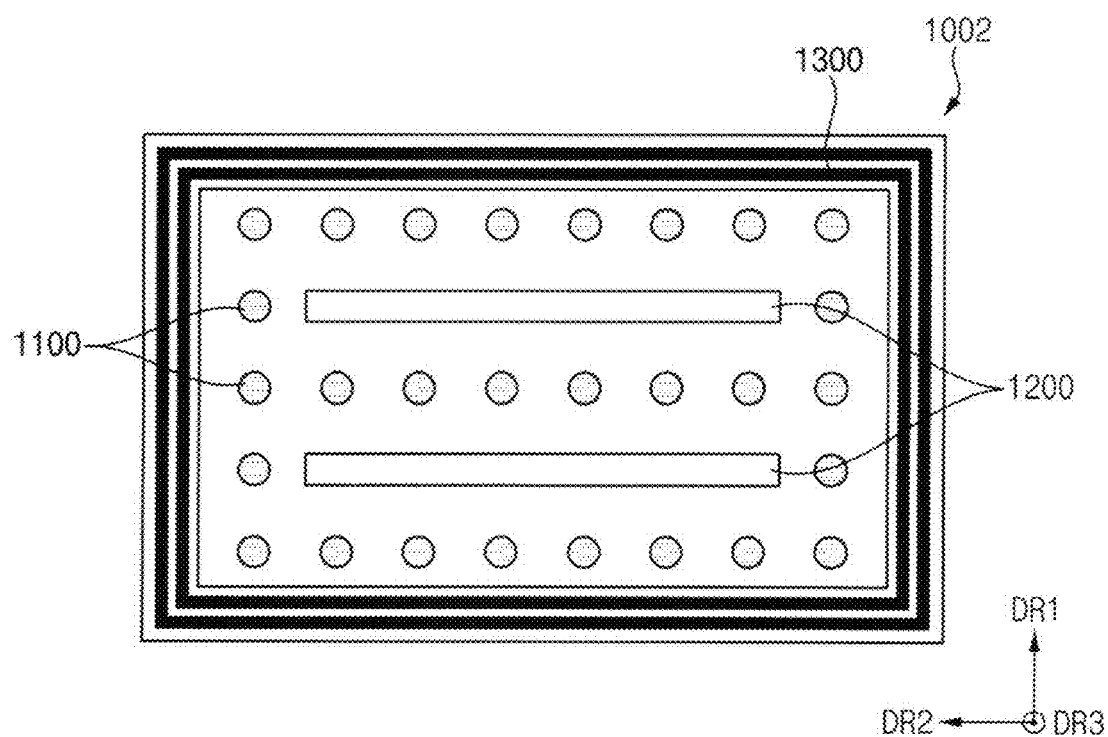
FIG. 12 is a plan view illustrating still another example of the nozzle.

FIG. 12 is a plan view illustrating still another example of the nozzle.

Referring to FIG. 12, in this embodiment, the etching solution injection holes 1100 may be disposed adjacent to a center of a nozzle 1002 and long sides and short sides of the nozzle 1002. Each of the etching solution injection holes 1100 may have a circular shape in a plan view. In FIG. 12, twenty eight etching solution injection holes 1100 are illustrated as an example. Each of the etching solution collection holes 1200 may be disposed between the etching solution injection holes 1100. In FIG. 11, two etching solution collection holes 1200 are illustrated as an example. Like in FIG. 9, a portion between a portion of the nozzle 1002 in which the etching solution injection holes 1100 are defined and a portion of the nozzle 1002 in which the etching solution collection holes 1200 are defined may be inclined. Therefore, the etching solution collection holes 1200 may collect the remaining etching solution 1600 more easily. The nozzle 1002 according to FIG. 12 may include more the etching solution injection holes 1100 and the etching solution collection holes 1200 than the nozzle 1000 according to FIG. 9. Accordingly, the nozzle 1002 according to FIG. 12 may provide more of the etching solution 1600 to the etching object 40 at one time. In addition, the nozzle 1002 according to FIG. 12 may collect more of the etching solution 1600 remaining on the etching object 40 at one time. Accordingly, a time required to perform an etching process of the etching object 40 may be effectively reduced.

Referring to FIGS. 1, 8, 9, and 10, in an embodiment, the sealing part 1300 may surround the etching solution injection hole 1100 and the etching solution collection hole 1200 in a plan view. That is, the etching solution injection hole 1100 and the etching solution collection hole 1200 may exist inside an area surrounded by the sealing part 1300. The sealing part 1300 may be disposed in an edge of the nozzle 1000.

The sealing part 1300 may prevent the etching solution 1600 from leaking from the etching area EA to the non-etching area NEA. The sealing part 1300 may entirely contact the etching object 40. For example, the sealing part 1300 may contact a lower surface 110*a* of the first substrate 110. The lower surface 40*a* of the etching object 40 may mean the lower surface 110*a* of the first substrate 110. Specifically, the sealing part 1300 may contact to an edge of the etching area EA of the first substrate 110. A material may not leak from inside of the sealing part 1300 to outside of the sealing part 1300, by the sealing part contacting the etching area EA and attaching to the etching area EA. That is, the sealing part 1300 may prevent the etching solution 1600 from leaking from the etching area EA to the non-etching area NEA.

The etching solution injection hole 1100 and the etching solution collection hole 1200 are disposed in a center of the nozzle 1000, and the sealing part 1300 is disposed in an edge of the nozzle 1000, so that the etching solution 1600 may be located in a space sealed by the sealing part 1300. In a plan view, a shape of the sealing part 1300 is illustrated in a square shape, but the shape of the sealing part 1300 according to the invention is not limited thereto. The shape of the sealing part 1300 may be determined according to a shape of the etching area EA.

The sealing part 1300 may have adhesiveness and may have elasticity. In addition, the sealing part 1300 may have excellent chemical resistance in order not to be damaged by the etching solution 1600. The sealing part 1300 may include a fluorine-based rubber. For example, the sealing part 1300 may include at least one of a fluoroelastomer and a perfluoroelastomer. The fluorine-based rubber may have excellent chemical resistance to a strong basic liquid, which is the etching solution 1600. Accordingly, the sealing part 1300 may not be damaged by the etching solution 1600 and leakage of the etching solution 1600 may be prevented.

The sealing part 1300 may include one or more sealing rings 1310, 1320. When the sealing rings 1310, 1320 are two or more, leakage of the etching solution 1600 may be prevented more easily than when the sealing ring is one. For example, the sealing part 1300 may include a first sealing ring 1310 and a second sealing ring 1320. The first sealing ring 1310 may be disposed closer to the etching solution collection hole 1200 and the etching solution injection hole 1100 than the second sealing ring 1320. The second sealing ring 1320 may be disposed outside of the first sealing ring 1310. Accordingly, the first sealing ring 1310 may primarily prevent leakage of the etching solution 1600. When the etching solution 1600 leaks from the first sealing ring 1310, the second sealing ring 1320 may prevent leakage of the leaked etching solution 1600. Accordingly, leakage of the etching solution 1600 to the outside of the second sealing ring 1320 may be prevented.

Since the sealing part 1300 needs to contact the first substrate 110, the nozzle unit 30 including the sealing part 1300 may further include a moving member. That is, the moving member may move the nozzle unit 30 up and down. The nozzle unit 30 may move in a third direction DR3 by the moving member. By moving of the nozzle unit 30, the sealing part 1300 included in the nozzle unit 30 may contact the lower surface 110*a* of the first substrate 110. The etching solution 1600 may be provided from the etching solution injection hole 1100 to the first substrate 110 after the sealing part 1300 contacts the lower surface 110*a* of the first substrate 110 and the etching area is sealed. After the etching area EA of the first substrate 110 is etched, the nozzle unit 30 may move in a fourth direction DR4 opposite to the third direction DR3 to be disposed in an original position.

The piping part 1400 may be disposed inside the nozzle 1000. The piping part 1400 may supply the etching solution 1600 to the etching solution injection hole 1100. The piping part 1400 may be connected to a storage unit. The storage unit storing the etching solution 1600 may be disposed inside the etching device 1 or in another area outside the etching device 1. The storage unit may supply the etching solution 1600 by being connected to the piping part 1400 inside the etching device 1.

The heating part 1500 may be disposed around the piping part 1400. The heating part 1500 may be built inside the nozzle 1000. The heating part 1500 may heat the etching solution 1600 passing through the piping part 1400 by disposed around the piping part 1400. Accordingly, the heating part 1500 may control or maintain a constant temperature of the etching solution 1600. Since the etching solution 1600 etches the etching object 40 in an optimum temperature, a time required for etching the etching object 40 may be effectively reduced.

The nozzle unit 30 may include at least one nozzle 1000. For example, as illustrated in the drawing, three or more nozzles 1000 may be included. That is, the number of the nozzles 1000 included in the nozzle unit 30 may be the same as the number of the etching areas EA. In addition, each of the nozzles 1000 may be disposed at the same position as each of the etching areas EA.

In an embodiment, since the nozzle 1000 includes the sealing part 1300, only the etching area EA may be etched. In an etching process of a substrate included in an conventional display device, a photo process may be required to etch only the etching area of the substrate. The photo process may include a coating process, an exposure process, a development process and a removing process. Therefore, a process of manufacturing the display device may be complicated and may need a large cost. However, since the etching device 1 according to the present invention includes the sealing part 1300, only the etching area EA may be etched. Accordingly, other devices except the nozzle unit 30, the cleaning unit 50, and the drying unit 60 included in the etching device 1 may not be additionally required. In addition, an additional coating process, the exposure process, and the development process may not be required except the process of moving the nozzle unit 30 up and down and etching the etching area EA. Accordingly, the process of manufacturing the display device may be simplified and cost may be effectively reduced.

Referring to FIGS. 1 and 8, the fixing member 20 included in the etching device 1 may fix the etching object 40. For example, the fixing member 20 may be one of support members including an adsorption member and a clamp. When the fixing member 20 is the adsorption member, the adsorption member may include one or more vacuum holes. The adsorption member may make the vacuum holes in a vacuum state and may provide a predetermined adsorption force to the etching object 40 through the vacuum holes maintained in the vacuum state. As a result, the etching object 40 may be fixed to the fixing member 20. In addition, the fixing member 20 may be the support member including the clamp. The etching object 40 may be fixed with the clamp and an etching process may be performed. However, the etching device 1 according to the present invention is not limited thereto, and the etching device 1 may fix the etching object 40 using an electrostatic chuck or a clamp.

FIG. 13 is a cross-sectional view illustrating an example of a cleaning unit included in an etching device.

Referring to FIG. 13, the cleaning unit 50 included in the etching device 1 may clean the etching solution 1600 remaining in the etching object 40 after the etching object 40 is etched. Since when the etching solution 1600 remains in the etching object 40, the non-etching area NEA may be etched by the etching solution 1600, so it is desirable that the etching solution 1600 may be removed. Therefore, after the nozzle unit 30 is detached from the etching object 40, the cleaning unit 50 may move toward the etching object 40 and may spray a cleaning solution 51 to the etching object 40. In an embodiment, the cleaning unit 50, unlike the nozzle unit 30, may spray the cleaning solution 51 to the entirety of the etching area EA and the non-etching area NEA of the etching object 40.

FIG. 14 is a cross-sectional view illustrating an example of a drying unit included in an etching device.

Referring to FIG. 14, the drying unit 60 may remove the cleaning solution 51 remaining on the etching object 40 after the etching object 40 is cleaned. For example, the drying unit 60 may remove the cleaning solution 51 by spraying high-pressure air.

FIGS. 15 to 19 are cross-sectional views illustrating an etching method according to an embodiment of the present invention.

Among the etching methods of the etching device 1 described with reference to FIGS. 15 to 19, matters in common with the etching device 1 described with reference to FIGS. 1 to 14 have been described above, and thus may be omitted below.

Figure 15:
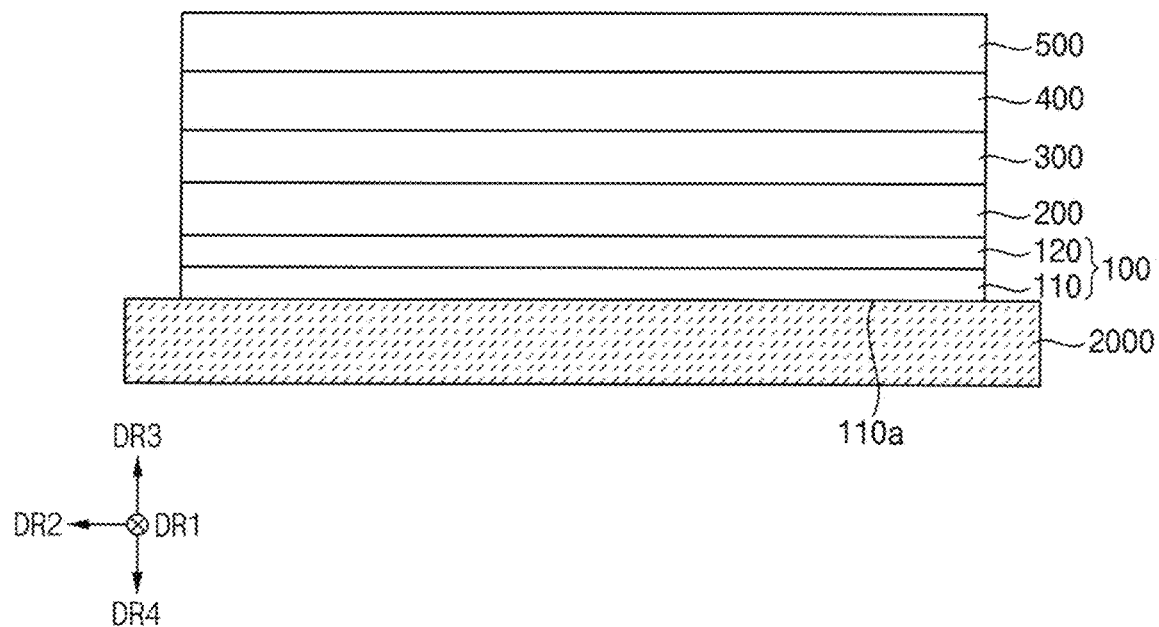
FIGS. 15 to 19 are cross-sectional views illustrating an etching method according to an embodiment of the present invention.

Referring to FIG. 15, the etching object 40 may be disposed on an auxiliary substrate 2000. The etching object 40 may include a substrate layer 100, a thin film transistor layer 200, a light emitting diode layer 300, an encapsulation layer 400, and a protective film 500. The substrate layer 100 may include a first substrate 110 and a second substrate 120. The etching object 40 may be disposed on the auxiliary substrate 2000. Specifically, a lower surface 110a of the first substrate 110 may contact the auxiliary substrate 2000. The auxiliary substrate 2000 may serve to support the etching object 40 during a process before the etching process is performed. The etching object 40 may be detached from the auxiliary substrate 2000 before the etching process is performed.

Figure 16:
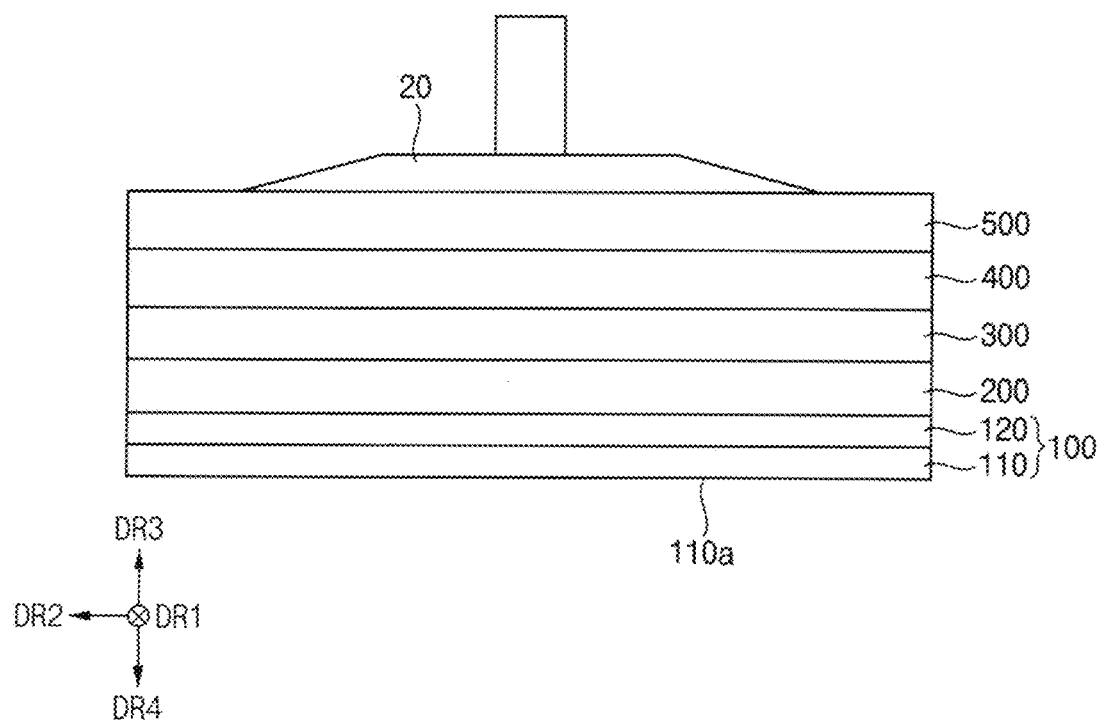

Referring to FIG. 16, the etching object 40 may be fixed to the fixing member 20 included in the etching device 1. In order to perform the etching process, the etching object 40 may be fixed to the fixing member 20. The fixing member 20 may be a support member including an adsorption member or a clamp. For example, the fixing member 20 may be the adsorption member. The fixing member 20 may be attached to the protective film 500 included in the etching object 40. Since the lower surface 110a of the first substrate 110 corresponding to the lower surface of the etching object 40 is a portion in which the etching area EA exists, the fixing member 20 may be attached to an upper surface of the protective film 500 corresponding to an upper surface of the etching object 40.

However, embodiments according to the present invention are not limited thereto, and in other embodiments, the etching device 1 may further include a stage in which the etching object 40 is disposed. The etching object 40 may be disposed on the stage after detached from the auxiliary substrate 2000. In this case, the etching object 40 of FIG. 15 may be disposed on the stage in an inverted form left and right. That is, in order to protect the first substrate 110, the etching object 40 may be disposed on the stage so that the protective film 500 contacts the stage. In order for the etching device 1 to etch the first substrate 110, the etching object 40 may be inverted to the left and right again by the fixing member 20. Accordingly, the first substrate 110 may be disposed under the etching object 40, and the lower surface 110a of the first substrate 110 may be etched.

Figure 17:
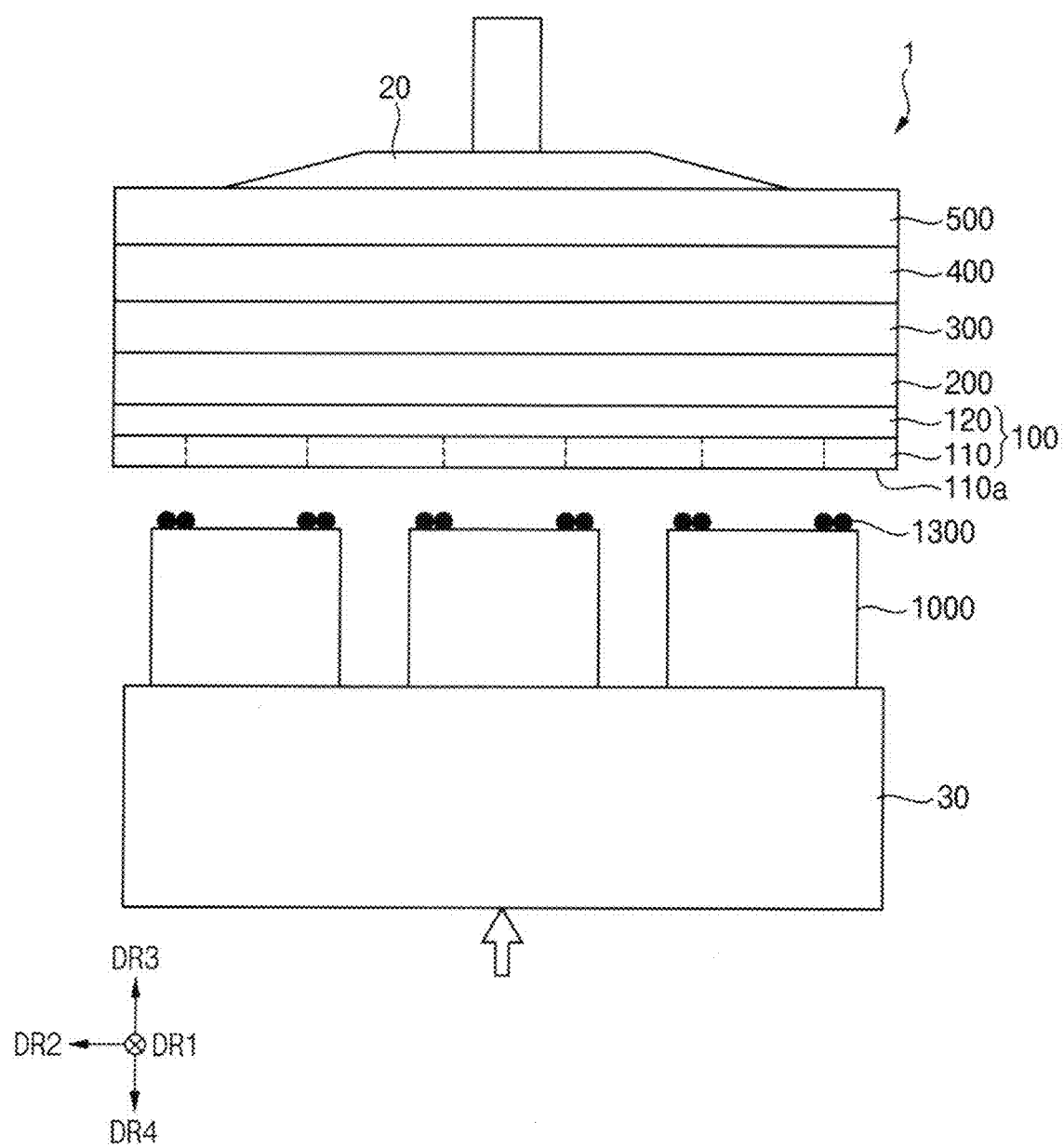

Referring to FIG. 17, after the etching object 40 is fixed to the fixing member 20, the nozzle unit 30 included in the etching device 1 may move toward the etching object 40. That is, the nozzle unit 30 may move in the third direction DR3, which is a direction toward the lower surface of the etching object 40. The nozzle unit 30 may further include a moving member to move the nozzle unit 30. The moving member may move in the third direction DR3 and the fourth direction DR4. Accordingly, the nozzle unit 30 may also move in the third direction DR3 and the fourth direction DR4.

Figure 18:
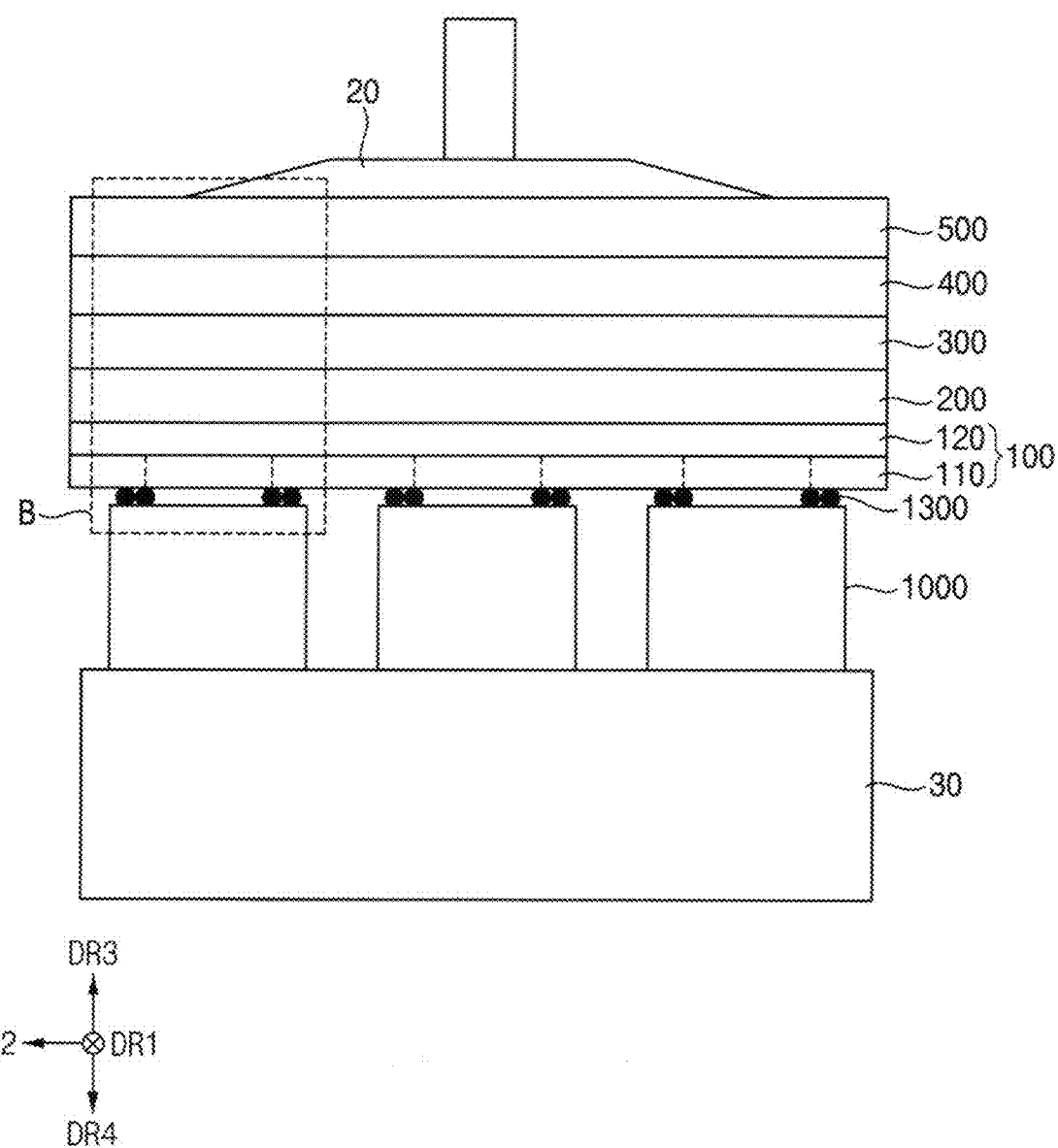
Figure 19:
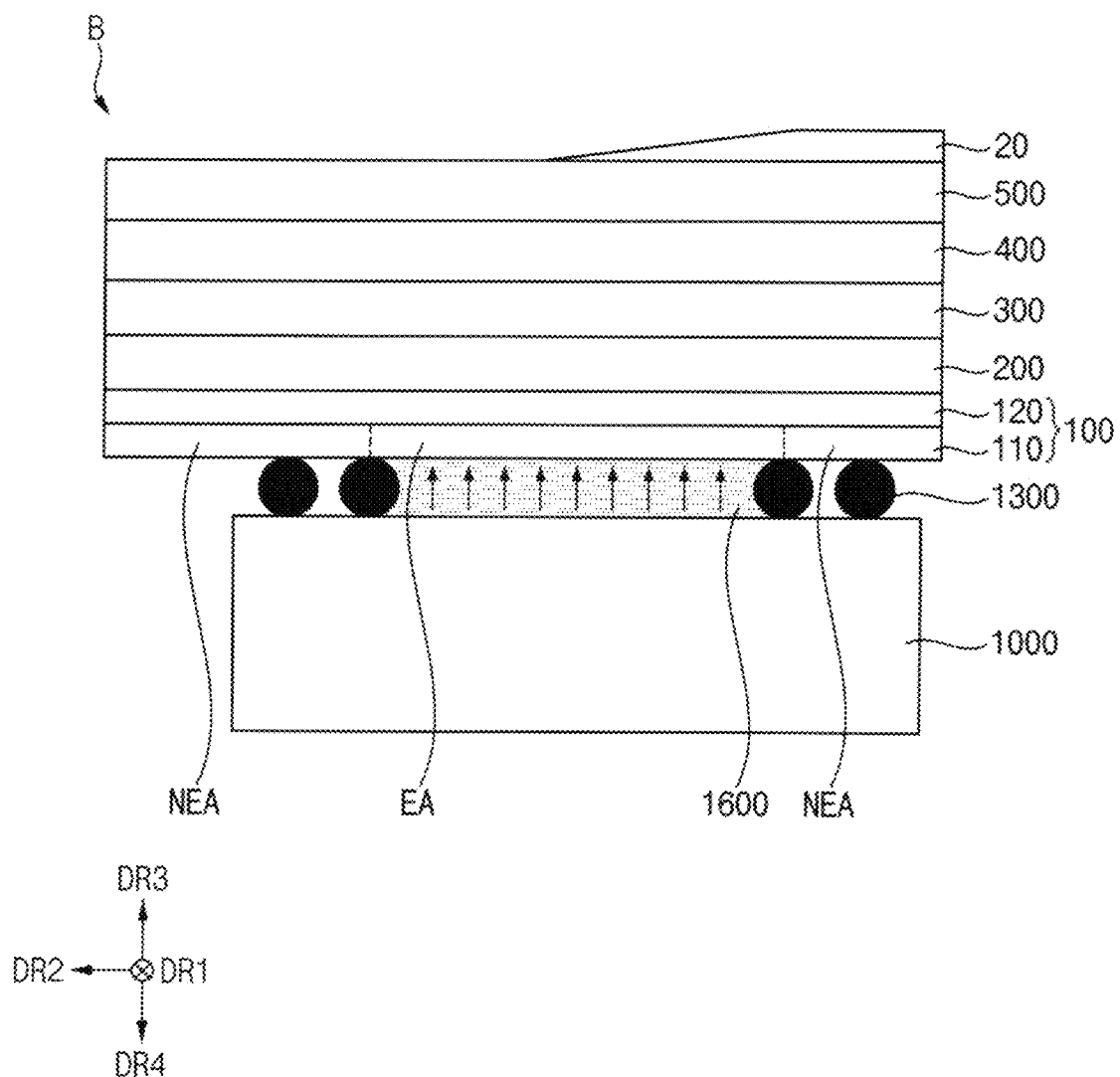

Referring to FIGS. 18 and 19, the nozzle unit 30 may contact the lower surface of the etching object 40. For example, FIG. 19 may be an enlarged cross-sectional view of an area B of FIG. 18. Specifically, the plurality of nozzles 1000 included in the nozzle unit 30 may contact the lower surface 110a of the first substrate 110. Each of the nozzles 1000 may be disposed in the same position as the etching areas EA. Each of the nozzles 1000 may contact with each of the etching areas EA.

Referring further to FIG. 9, each of the nozzles 1000 may include an etching solution injection hole 1100, an etching solution collection hole 1200, and a sealing part 1300. The sealing part 1300 may seal the etching area EA from an outside by contacting an edge of the etching area EA.

After the sealing part 1300 entirely contacts the etching area EA, the etching solution collection hole 1200 may provide the etching solution 1600 to the etching area EA. The sealing part 1300 may place the etching solution 1600 in a space sealed by the sealing part 1300. Accordingly, the etching solution 1600 may not leak into the non-etching area NEA, and only the etching areas EA of the first substrate 110 may be etched. The etching solution 1600 remaining after etching the etching area EA may be collected through the etching solution collection hole 1200.

After the nozzle unit 30 etches the etching area EA, the nozzle unit 30 may move in a fourth direction DR4. That is, the nozzle unit 30 may move to an original position like in FIG. 17. In this case, the sealing part 1300 may be detached from the first substrate 110.

Referring to FIGS. 13 and 14, after the etching object 40 is etched, the cleaning unit 50 may remove the etching solution 1600 remaining on the etching object 40. That is, the cleaning unit 50 may clean the etching object 40 by spraying the cleaning solution to the first substrate 110 of the etching object 40. In addition, after the etching object 40 is cleaned, the drying unit 60 may remove the cleaning solution 51 remaining on the etching object 40. That is, the drying unit 60 may dry the cleaning solution 51 by spraying high-pressure air.

In a conventional etching method, since an etching device etches an etching object above the etching object, an upper surface of the etching object may be etched. In this case, an etching solution remaining on the etching object may move to a side of the etching object by gravity or external force. As the etching solution moves along upper and side surfaces of the etching object, a non-etching area excluding an etching area and other members excluding a substrate may be damaged.

In the etching method according to the present embodiment, the etching device 1 may be disposed under the etching object 40. Since the etching device 1 is disposed under the etching object 40 to etch the lower surface 110*a* of the etching object 40, the etching solution 1600 remaining after etching the etching object 40 may fall in the fourth direction DR4 by the gravity. That is, the etching solution 1600 may not move to the non-etching area NEA excluding the etching area EA. Therefore, even if the etching solution 1600 remains, the non-etching area NEA and the other members 12, 200, 300, 400, and 500 excluding the first substrate 110 may not be damaged. Accordingly, the etching method may improve an accuracy of the etching of the etching object 40 and the quality of the etching object 40 may be improved.

The display device according to the embodiments may be applied to a display device included in a computer, a notebook, a mobile phone, a smartphone, a smart pad, a PMP, a PDA, an MP3 player, or the like.

Although the methods and the systems according to the embodiments have been described with reference to the drawings, the illustrated embodiments are examples, and may be modified and changed by a person having ordinary knowledge in the relevant technical field without departing from the technical spirit described in the following claims.

What is claimed is:

1. An etching device comprising:
a nozzle unit including at least one nozzle including an etching solution injection hole, an etching solution collection hole, and a seal,
wherein the etching solution injection hole is configured to provide an etching solution to an etching object, the etching solution collection hole is configured to collect the etching solution, and
wherein the seal surrounds the etching solution injection hole and the etching solution collection hole to prevent the etching solution from leakage, and
wherein the etching solution collection hole is disposed in a level lower than a level where the etching solution injection hole is disposed, and
wherein the etching solution collection hole and the etching solution injection hole are separate and not in fluid communication with each other within the nozzle unit.

2. The etching device of claim 1, wherein the seal includes a fluorine-based rubber.

3. The etching device of claim 1, wherein the seal is disposed in an edge of the nozzle, and
wherein the seal surrounds entire edges of an etching area of the etching object in a plan view.

4. The etching device of claim 1, wherein the seal includes at least one sealing ring.

5. The etching device of claim 1,
wherein the etching object includes an etching area and a non-etching area,
wherein the etching area is an area on which the etching solution is provided,
wherein the non-etching area is a remaining area of the etching object excluding the etching area, and
wherein the seal contacts with an edge of the etching area.

6. The etching device of claim 5, wherein the seal places the etching solution in a sealed space sealed by the seal.

7. The etching device of claim 5, wherein the etching area is an area to be bonded to a circuit member.

8. The etching device of claim 5,
wherein the etching object includes a substrate, and
wherein the substrate includes the etching area and the non-etching area.

9. The etching device of claim 8, wherein the substrate includes polyimide (PI).

10. The etching device of claim 1,
wherein the nozzle further includes piping and a heater,
the piping is connected to the etching solution injection hole and is configured to provide the etching solution to the etching solution injection hole, and
the heater is disposed around the piping part and is configured to control a temperature of the etching solution.

11. The etching device of claim 1, further comprising a fixing structure configured to fix the etching object.

* * * * *